United States Patent
Kalitsov et al.

(10) Patent No.: US 12,211,535 B2
(45) Date of Patent: *Jan. 28, 2025

(54) MAGNETORESISTIVE MEMORY DEVICE AND METHOD OF OPERATING SAME USING FERROELECTRIC-CONTROLLED EXCHANGE COUPLING

(71) Applicant: SANDISK TECHNOLOGIES LLC, Addison, TX (US)

(72) Inventors: Alan Kalitsov, San Jose, CA (US); Derek Stewart, Livermore, CA (US); Ananth Kaushik, Santa Clara, CA (US); Gerardo Bertero, Fremont, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 55 days.

This patent is subject to a terminal disclaimer.

(21) Appl. No.: 17/656,310

(22) Filed: Mar. 24, 2022

(65) Prior Publication Data
US 2023/0307028 A1  Sep. 28, 2023

(51) Int. Cl.
*G11C 11/16* (2006.01)
*G01R 33/09* (2006.01)
(Continued)

(52) U.S. Cl.
CPC .......... *G11C 11/161* (2013.01); *G01R 33/093* (2013.01); *G11C 11/1673* (2013.01);
(Continued)

(58) Field of Classification Search
CPC .............. G11C 11/161; G11C 11/1673; G11C 11/1675; G11C 11/22; G01R 33/093;
(Continued)

(56) References Cited

U.S. PATENT DOCUMENTS 10,788,547 B2  9/2020  Kalitsov et al.
10,937,809 B1  3/2021  Sharangpani et al.
(Continued)

OTHER PUBLICATIONS

Lou, J. et al., "Giant Electric Field Tuning of Magnetism in Novel Multiferroic FeGaB/Lead Zinc Niobate-Lead Titanate (PZN-PT) Heterostructures," *Advanced Materials*, vol. 21, pp. 4711-4715, (2009); doi:10.1002/adma.200901131.
(Continued)

*Primary Examiner* — Douglas King
(74) *Attorney, Agent, or Firm* — THE MARBURY LAW GROUP PLLC

(57) ABSTRACT

A magnetoresistive memory cell includes a magnetoresistive layer stack containing a reference layer, a nonmagnetic spacer layer, and a free layer. A ferroelectric material layer having two stable ferroelectric states is coupled to a strain-modulated ferromagnetic layer to alter a sign of magnetic exchange coupling between the strain-modulated ferromagnetic layer and the free layer. The strain-modulated ferromagnetic layer may be the reference layer or a perpendicular magnetic anisotropy layer that is located proximate to the ferroelectric material layer. The magnetoresistive memory cell may be configured as a three-terminal device or as a two-terminal device, and may be configured as a tunneling magnetoresistance (TMR) device or as a giant magnetoresistance (GMR) device.

12 Claims, 5 Drawing Sheets

(51) Int. Cl.
*H01F 10/32* (2006.01)
*H10B 61/00* (2023.01)
*H10N 50/10* (2023.01)
*H10N 50/80* (2023.01)
*H10N 50/85* (2023.01)

(52) U.S. Cl.
CPC ...... *G11C 11/1675* (2013.01); *H01F 10/3286* (2013.01); *H10B 61/00* (2023.02); *H10N 50/10* (2023.02); *H10N 50/80* (2023.02); *H10N 50/85* (2023.02)

(58) Field of Classification Search
CPC ........ H10N 50/10; H10N 50/80; H10N 50/85; H01F 10/3286; H01F 10/3254
See application file for complete search history.

(56) References Cited

U.S. PATENT DOCUMENTS

| | | |
|---|---|---|
| 10,964,748 B1 | 3/2021 | Prasad et al. |
| 10,991,407 B1 | 4/2021 | Prasad et al. |
| 11,005,034 B1 | 5/2021 | Prasad et al. |
| 11,024,648 B2 | 6/2021 | Sharangpani et al. |
| 11,049,538 B2 | 6/2021 | Kalitsov et al. |
| 11,056,640 B2 | 7/2021 | Prasad et al. |
| 11,069,741 B2 | 7/2021 | Prasad et al. |
| 11,152,048 B1 | 10/2021 | Prasad et al. |
| 11,200,934 B2 | 12/2021 | Prasad et al. |
| 11,417,379 B2 | 8/2022 | Kalitsov et al. |
| 2004/0257849 A1 | 12/2004 | Jeong |
| 2006/0011958 A1 | 1/2006 | Jeong et al. |
| 2014/0247653 A1 | 9/2014 | Wang et al. |
| 2015/0041934 A1 | 2/2015 | Khvalkovskiy et al. |
| 2017/0179373 A1 | 6/2017 | Swerts et al. |
| 2018/0123031 A1 | 5/2018 | Adelmann et al. |
| 2018/0358542 A1* | 12/2018 | Mihajlovic ......... G11C 11/1673 |
| 2019/0165255 A1* | 5/2019 | Zhu ....................... G11C 11/161 |
| 2021/0066348 A1 | 3/2021 | Prasad et al. |
| 2021/0074727 A1 | 3/2021 | Prasad et al. |
| 2021/0159392 A1 | 5/2021 | Prasad et al. |
| 2021/0210676 A1 | 7/2021 | Prasad |
| 2021/0210677 A1 | 7/2021 | Prasad |
| 2021/0225421 A1 | 7/2021 | Mihajlovic et al. |
| 2021/0242279 A1 | 8/2021 | Prasad et al. |
| 2021/0320245 A1 | 10/2021 | Kalitsov et al. |
| 2021/0408020 A1 | 12/2021 | Makala et al. |

OTHER PUBLICATIONS

Song, C. et al., "Recent progress in voltage control of magnetism: Materials, mechanisms, and performance," Progress in Materials Science, vol. 87, pp. 33-82, (2017); https://doi.org/10.1016/j.pmatsci.2017.02.002.

Wang, X. et al., "E-field Control of the RKKY Interaction in FeCoB/Ru/FeCoB/PMN-PT (011) Multiferroic Heterostructures," *Advanced Materials*, vol. 30, pp. 1-8, (2018); 1803612pp. doi:10.1002/adma.201803612.

Yang, Q. et al., "Ionic liquid gating control of RKKY interaction in FeCoB/Ru/FeCoB and (Pt/Co)2/Ru/(Co/Pt)2 multilayers," *Nature Communications*, vol. 9, No. 991, pp. 1-11,, (2018); doi:10.1038/s41467-018-03356-z.

U.S. Appl. No. 17/656,306, filed Mar. 24, 2022, SanDisk Technologies LLC.

USPTO Office Communication, Notice of Allowance and Fee(s) Due for U.S. Appl. No. 17/656,306, dated Dec. 8, 2023, 10 pages.

* cited by examiner

MAGNETORESISTIVE MEMORY DEVICE AND METHOD OF OPERATING SAME USING FERROELECTRIC-CONTROLLED EXCHANGE COUPLING

FIELD

The present disclosure relates generally to the field of magnetic memory devices and specifically to magnetoresistive memory devices and methods of operating the same using ferroelectric-controlled exchange coupling.

BACKGROUND

Spin-transfer torque (STT) refers to an effect in which the orientation of a magnetic layer in a magnetic junction structure or spin valve is modified by a spin-polarized current. Generally, electric current is unpolarized with electrons having random spin orientations. A spin polarized current is one in which electrons have a net non-zero spin due to a preferential spin orientation distribution. A spin-polarized current can be generated by passing electrical current through a magnetic polarizer layer. When the spin-polarized current flows through a free layer of a magnetic junction structure or a spin valve, the electrons in the spin-polarized current can transfer at least some of their angular momentum to the free layer, thereby producing a torque on the magnetization of the free layer. When a sufficient amount of spin-polarized current passes through the free layer, spin-transfer torque can be employed to flip the orientation of the spin (e.g., change the magnetization) in the free layer. A resistance differential of a magnetic junction structure between different magnetization states of the free layer can be employed to store data within the magnetoresistive random access memory (MRAM) cell depending if the magnetization of the free layer is parallel or antiparallel to the magnetization of the polarizer layer, also known as a reference layer.

SUMMARY

According to an aspect of the present disclosure, a memory device includes at least one three-terminal magnetoresistive memory cell 380 which comprises a first terminal electrode 32, a second terminal electrode, a middle electrode located between the first terminal electrode and the second terminal electrode, a magnetoresistive layer stack comprising a reference layer, a free layer and a nonmagnetic spacer layer located between the reference layer and the free layer, wherein the magnetoresistive layer stack is located between the first terminal electrode and the middle electrode, and a ferroelectric material layer located between the middle electrode and the second terminal electrode.

According to another aspect of the present disclosure, a memory device includes at least one magnetoresistive memory cell which comprise a first terminal electrode, a second terminal electrode, a magnetoresistive layer stack comprising a reference layer, a free layer and a dielectric tunnel barrier layer located between the reference layer and the free layer, wherein the magnetoresistive layer stack is located between the first terminal electrode and the second terminal electrode, a perpendicular magnetic anisotropy (PMA) layer having a higher PMA than a PMA of the free layer, wherein the PMA layer is located between the second terminal electrode and the magnetoresistive layer stack, a nonmagnetic electrically conductive layer located between the PMA layer and the free layer, and a ferroelectric material layer located between the PMA layer and the second terminal electrode.

DETAILED DESCRIPTION

Figure 1:
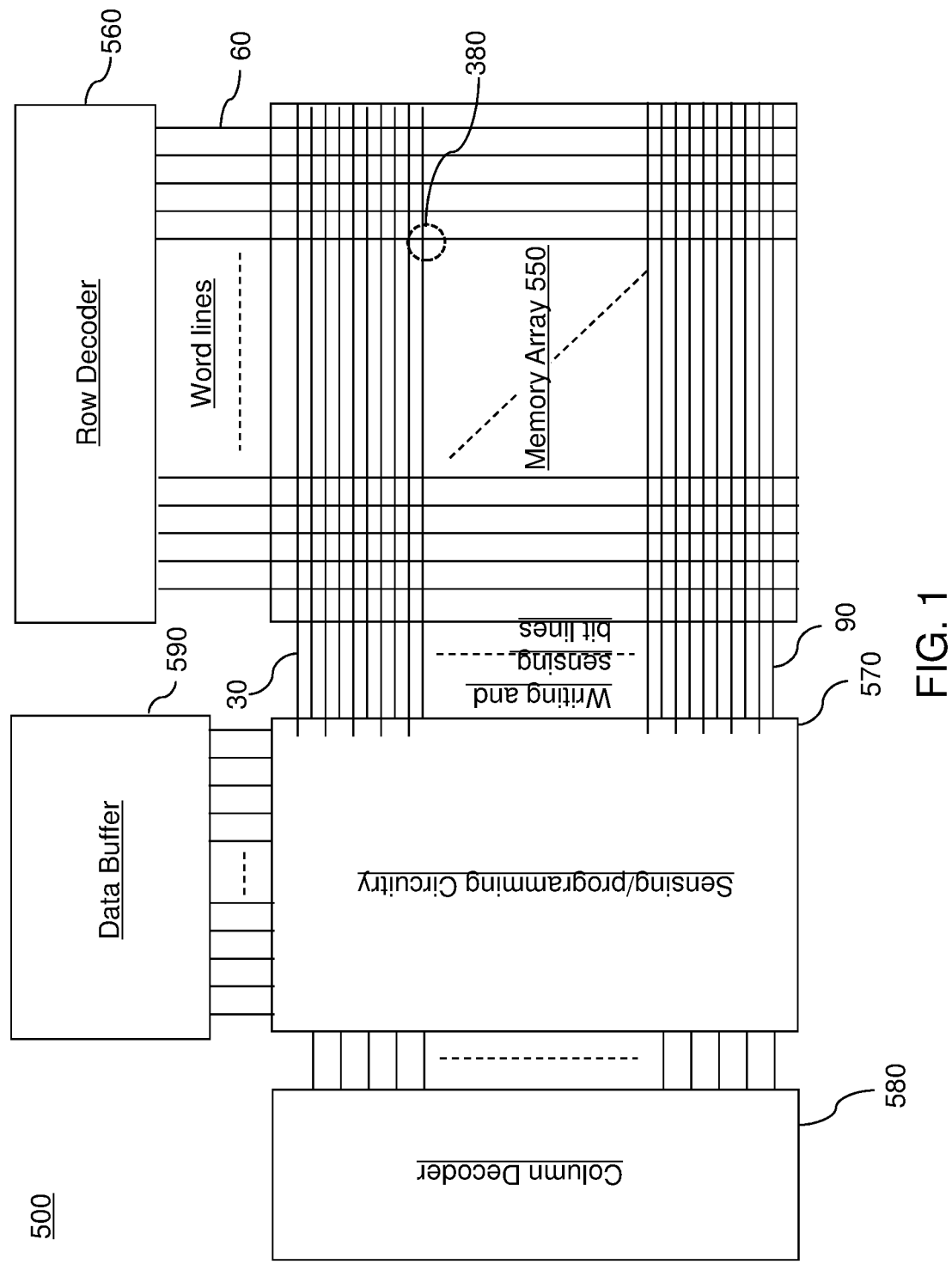
FIG. 1 is a schematic diagram of an exemplary circuit including an array of three-terminal magnetoresistive memory cells according to an embodiment of the present disclosure.

As discussed above, the embodiments of the present disclosure are directed to magnetoresistive memory devices and methods of operating the same using ferroelectric-controlled exchange coupling, the various aspects of which are described below.

The drawings are not drawn to scale. Multiple instances of an element may be duplicated where a single instance of the element is illustrated, unless absence of duplication of elements is expressly described or clearly indicated otherwise. Same reference numerals refer to the same element or to a similar element. Elements having the same reference numerals are presumed to have the same material composition unless expressly stated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, an "in-process" structure or a "transient" structure refers to a structure that is subsequently modified.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" refers to a layer that has a predominant direction of extension, i.e., having a direction along which the layer extends the most.

Referring to FIG. 1, a schematic diagram is shown for an exemplary circuit including an array of three-terminal memory cells 380 according to the first and second embodiments of the present disclosure. The exemplary circuit may comprise a random access memory (RAM) device 500 including the memory cells 380 in an array configuration. As used herein, a "random access memory" (RAM) refers to a memory device containing memory cells that allow random access, e.g., access to any selected memory cell upon a command for reading the contents of the selected memory cell. According to an aspect of the present disclosure, the memory cells 380 comprise three-terminal magnetoresistive memory cells.

The RAM device 500 includes a memory array region 550 including word lines 60, sensing bit lines 30, and programming (i.e., writing) bit lines 90. In one embodiment, a first terminal electrode of each memory cell 380 can be electrically connected to one of the sensing bit lines 30, and a second terminal electrode of each memory cell 380 can be electrically connected to one of the programming (i.e., writing) bit lines 90. Alternatively, a first terminal electrode of each memory cell 380 can be electrically connected to one of the programming bit lines 90, and a second terminal electrode of each memory cell 380 can be electrically connected to one of the sensing bit lines 30. A third electrode, which is also referred to as a middle electrode, of each memory cell 380 may be connected to one of the word lines 60. In one embodiment, the sensing bit lines may be referred to as first electrically conductive lines 30 and the programming bit lines may be referred to as second electrically conductive lines 90. The word lines may be referred to as third electrically conductive lines 60. While the exemplary circuit illustrates an exemplary configuration for routing the programming bit lines, the sensing lines, and the word lines, various other types of routing of electrically conductive lines may also be employed provided that each memory cell 380 is accessed by a respective set of three different independently-controlled electrically conductive lines. Furthermore, the terms "bit line" and "word line" are arbitrary names that are assigned to various conductive lines for clarity, but should not be considered limiting.

In an illustrative example, the RAM device 500 may also contain a row decoder 560 connected to the word lines 60, a sense amplifier circuitry connected to the sensing bit lines 30, and a programming circuitry connected to the programming bit lines 90. In some embodiments, the sense amplifier circuitry and the programming circuitry are collectively referred to as a sensing/programming circuitry 570. A column decoder 580 and a data buffer 590 can be connected to the sensing/programming circuitry 570. A row decoder 560 can be connected to the word lines 60. Multiple instances of the memory cells 380 are provided in an array configuration that forms the RAM device 500. It should be noted that the location and interconnection of elements are schematic and the elements may be arranged in a different configuration. Further, a memory cell 380 may be manufactured as a discrete device, i.e., a single isolated device.

Each memory cell 380 includes a magnetic junction structure having at least two different resistive states depending on the alignment of magnetizations of different magnetic material layers. The magnetic junction structure within each memory cell 380 is provided between a first terminal electrode and a second terminal electrode. In one embodiment, the magnetic junction structure within each memory cell 380 can be provided between the first terminal electrode and a middle electrode.

Figure 2:
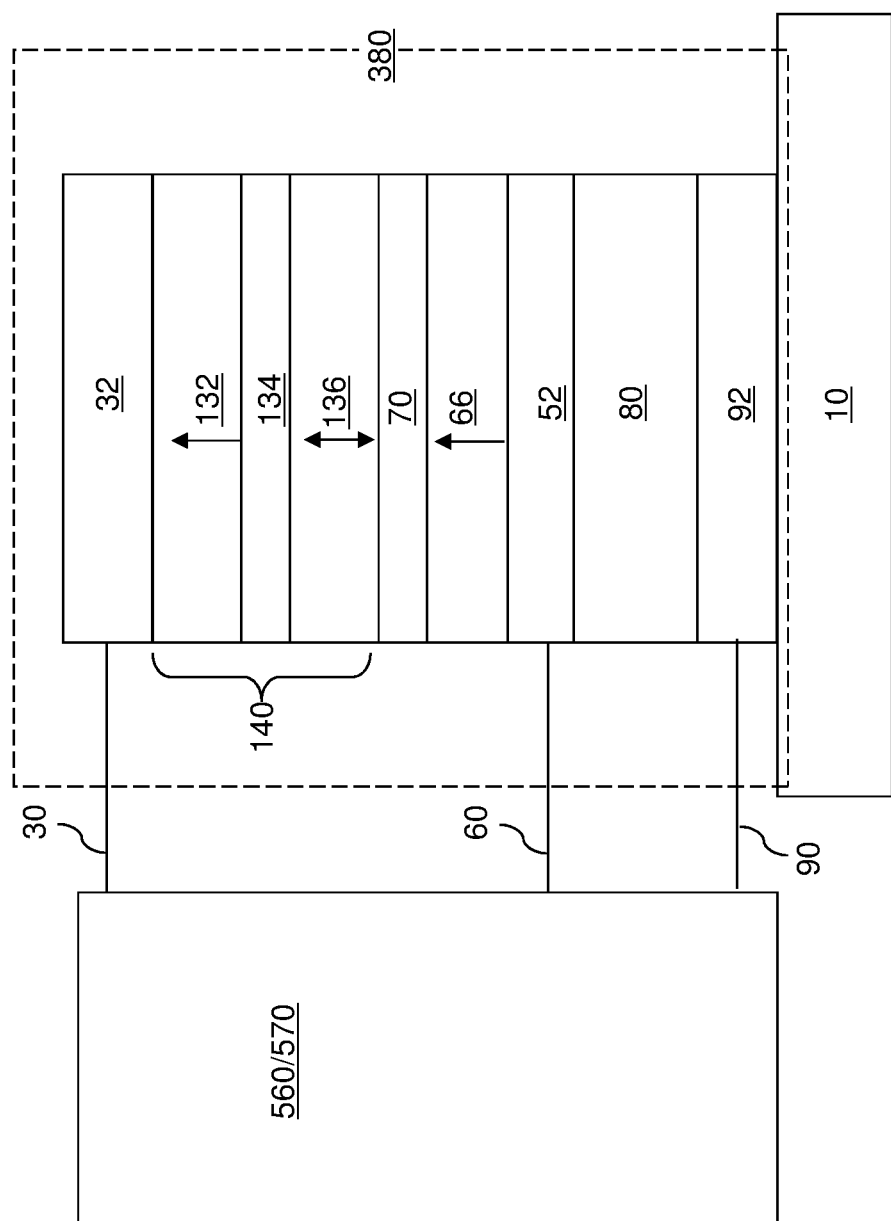
FIG. 2 illustrates a first exemplary magnetoresistive memory device according to a first embodiment of the present disclosure.

Referring to FIG. 2, a first exemplary magnetoresistive memory device according to a first embodiment of the present disclosure is illustrated, which comprises a memory cell 380 that is a three-terminal magnetoresistive memory cell and a portion of a sensing/programming circuitry configured to program the three-terminal magnetoresistive memory cell. The three-terminal magnetoresistive memory cell of FIG. 2 may comprise one memory cell 380 within the MRAM device 500 illustrated in FIG. 1, and the portion of the sensing/programming circuitry illustrated in FIG. 2 may be a portion of the peripheral (i.e., driver) circuitry illustrated in FIG. 1.

Figure 3:
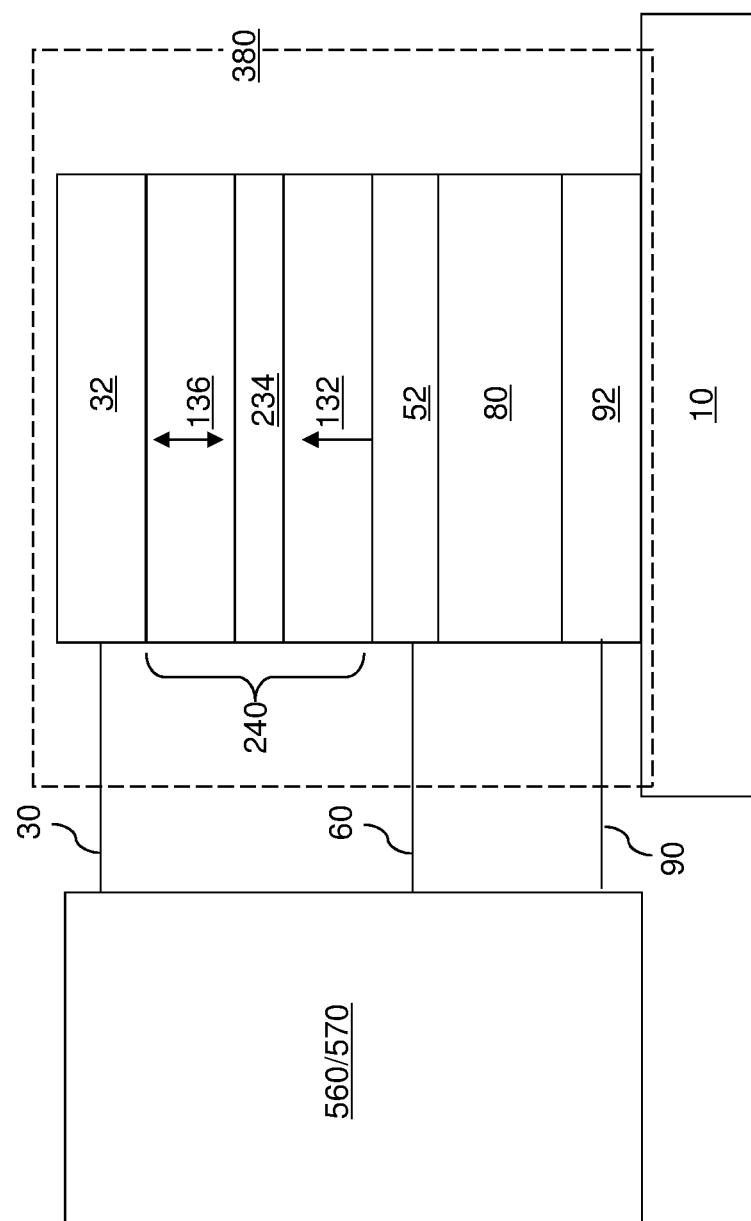
FIG. 3 illustrates a second exemplary magnetoresistive memory device according to a second embodiment of the present disclosure.

According to the first embodiment of the present disclosure, the three-terminal magnetoresistive memory cell illustrated in FIG. 2 may comprise, from one side to another in a sequential order, a first terminal electrode 32, a magnetic junction structure, such as a magnetic tunnel junction (MTJ) 140 (or a giant magnetoresistance (GMR) junction structure 240 illustrated in FIG. 3), a nonmagnetic electrically conductive layer 70, a perpendicular magnetic anisotropy (PMA) layer 66, a middle electrode 52, a ferroelectric material layer 80, and a second terminal electrode 92.

Generally, the three-terminal magnetoresistive memory cell can be formed over a substrate 10 by depositing and patterning various material layers for forming each component of the three-terminal magnetoresistive memory cell. For example, the substrate 10 may comprise a semiconductor substrate (e.g., silicon wafer) on which various semiconductor devices (such as field effect transistors) are formed, and dielectric material layers embedding metal interconnect structures that are electrically connected to the semiconductor devices. Alternatively, the substrate 10 may comprise an insulating (e.g., glass or ceramic) substrate or a conductive (e.g., metal) substrate. The second electrically conductive line 90 and the second terminal electrode 92 can be formed over the substrate 10. The second terminal electrode 92 may comprise a portion of the second electrically conductive line 90 or it may comprise a separate conductive layer which is electrically connected to the second electrically conductive line 90. The ferroelectric material layer 80 can be deposited over the second terminal electrode 92. A conductive material, such as a metal or metal alloy, may be deposited to form the third electrically conductive line 60 and the middle electrode 52. The third terminal electrode 92 may comprise a portion of the third electrically conductive line 60 or it may comprise a separate conductive layer which is electrically connected to the third electrically conductive line 60. A stack of material layers can be deposited and patterned to form a stack of the PMA layer 66, the nonmagnetic electrically conductive layer 70, and the magnetic junction structure (such as the magnetic tunnel junction 140 or the GMR junction). The first electrically conductive line 30 and the first terminal electrode 32 can be formed over the magnetic junction structure. The second terminal electrode 32 may comprise a portion of the first electrically conductive line 30 or it may comprise a separate conductive layer which is electrically connected to the first electrically conductive line 30. The above layers may be patterned into any desired shape, such as a pillar structure shown in FIG. 2 using one or more patterning (e.g., ion milling or etching) steps. Insulating layer or layers may be formed around the pillar structure and between the various electrically conductive lines.

Alternatively, the order of formation for the combination of the first terminal electrode 32, the magnetic tunnel junction 132, the nonmagnetic electrically conductive layer 70, the PMA layer 66, the middle electrode 52, the ferroelectric material layer 80, and the second terminal electrode 92 may be reversed. Generally, the magnetic junction structure includes a stack of a reference layer 132, a nonmagnetic spacer layer, and a free layer 136. In case the magnetic junction structure includes a magnetic tunnel junction 140 of the first embodiment, then the magnetic tunnel junction 140 can include a layer stack of a reference layer 132, a dielectric tunnel barrier layer 134, and a free layer 136. In case the magnetic junction structure includes the GMR junction structure 240 of the second embodiment, then the dielectric tunnel barrier layer 134 is replaced with a nonmagnetic electrically conductive (e.g., metal or metal alloy) spacer layer 234, as shown in FIG. 3.

Each of the first electrically conductive line 30, the first terminal electrode 32, the second terminal electrode 92, and the second electrically conductive line 90 can include a nonmagnetic electrically conductive material such as W, Al, Cu, Ru, Mo, TiN, TaN, WN, MoN, etc.

The ferroelectric material layer 80 includes a ferroelectric material, which may be a single crystalline ferroelectric material or a polycrystalline ferroelectric material. The crystallographic orientation of the single crystalline ferroelectric material can be selected such that a change in the electrical polarization in the ferroelectric material layer 80 induces a change in an average in-plane strain of the ferroelectric material layer 80. The average in-plane strain refers to the average of the in-plane strain in the ferroelectric material layer 80. An in-plane strain refers to the component of the strain that is measured along a horizontal plane that is perpendicular to a top surface of the ferroelectric material layer 80.

Alternatively, the ferroelectric material layer 80 comprises a polycrystalline ferroelectric material. The distribution of the crystallographic orientations within the grains of the polycrystalline ferroelectric material of the ferroelectric material layer 80 can be such that the ferroelectric material layer 80 can be programmed into two ferroelectric states having a net "upward" dielectric polarization or a net "downward" dielectric polarization. In one embodiment, the two ferroelectric states of the ferroelectric material layer 80 induce different average in-plane strains in the ferroelectric material layer 80.

In one embodiment, the ferroelectric material layer 80 can include a transition metal oxide material. In one embodiment, the transition metal oxide material comprises a hafnium oxide based material, which comprises doped or undoped hafnium oxide. In an illustrative example, the ferroelectric material layer 80 may include single crystalline hafnium oxide doped with zirconium (also referred to as hafnium-zirconium oxide), silicon, strontium, aluminum, yttrium, germanium and/or gadolinium.

In another embodiment, the transition metal oxide material comprises a perovskite material, such as barium titanate (BaTiO$_3$; BT), europium barium titanate, lead scandium tantalate (such as Pb(Sc$_x$Ta$_{1-x}$)O$_3$), lead titanate (such as PbTiO$_3$; PT), lead zirconate titanate (such as Pb (Zr,Ti) O$_3$; PZT), lithium niobate (such as LiNbO$_3$; LN), (LaAlO$_3$)), potassium niobate (such as KNbO$_3$), sodium bismuth titanate (such as Na$_{0.5}$Bi$_{0.5}$TiO$_3$), lithium tantalate (such as LiTaO$_3$ (LT), lead lanthanum titanate (such as (Pb,La)TiO$_3$ (PLT)), lead lanthanum zirconate titanate (such as (Pb,La)(Zr,Ti)O$_3$ (PLZT)), strontium titanate (SrTiO$_3$) or strontium ruthenate (SrRuO$_3$).

In one embodiment, the ferroelectric material layer 80 may comprise a multiferroic material. As used herein, a "multiferroic" material refers to a material that exhibits at least two of a ferromagnetic-type order (such as ferromagnetism, antiferromagnetism, or ferrimagnetism), ferroelectricity, and ferroelasticity. As used herein, a "magnetoelectric multiferroic" refers to a material that exhibits a ferromagnetic-type order and ferroelectricity. A change in total magnetization is coupled to a change in total electric polarization in a magnetoelectric multiferroic, and thus, a magnetic transition can be coupled to a change in the ferroelectric polarization and vice versa. In one embodiment, the ferroelectric material layer 80 comprises, and/or consists essentially of, a polycrystalline multiferroic material. The relative orientation between non-zero ferroelectric polarization non-zero magnetization of the magnetoelectric multiferroic material within each grain of the ferroelectric material layer 80 can be invariant upon reversal of a direction of the non-zero ferroelectric polarization of the grain. In an illustrative example, the relative orientation between the ferroelectric polarization of a crystalline grain of BiFeO$_3$ and the magnetization of BiFeO$_3$ of the crystalline grain of BiFeO$_3$ can be invariant upon reversal of a direction of the non-zero ferroelectric polarization of BiFeO$_3$, Generally, the ferroelectric material layer 80 may comprise any polycrystalline multiferroic material or a single crystalline multiferroic material that can generate a non-zero net magnetization along an axial direction either as deposited, or upon application of an initializing magnetic field or an initializing electrical field. In an illustrative example, the ferroelectric material layer 80 may comprise a material selected from BiFeO$_3$, h-YMnO$_3$, BaNiF$_4$, PbVO$_3$, BiMnO$_3$, LuFe$_2$O$_4$, HoMn$_2$O$_5$, h-HoMnO$_3$, h-ScMnO$_3$, h-ErMnO$_3$, h-TmMnO$_3$, h-YbMnO$_3$, h-LuMnO$_3$, K$_2$SeO$_4$, Cs$_2$CdI$_4$, TbMnO$_3$, Ni$_3$V$_2$O$_8$, MnWO$_4$, CuO, ZnCr$_2$Se$_4$, LiCu$_2$O$_2$, and Ni$_3$B$_7$O$_{13}$I. The ferroelectric material layer 80 may be deposited by a suitable deposition method such as physical vapor deposition.

The thickness of the ferroelectric material layer 80 may be in a range from 2 nm to 100 nm, such as from 5 nm to 30 nm, for example about 10 nm, although lesser and greater thicknesses may also be employed. A thermal anneal can be performed to improve crystallinity of the material of the ferroelectric material layer 80 and to enhance ferroelectric properties (such as magnitude of electrical polarization) of the ferroelectric material of the ferroelectric material layer 80. In an illustrative example, the ferroelectric material layer 80 may be a doped (e.g., Zr, Si or Al doped) hafnium oxide based ferroelectric layer having the ferroelectric non-centrosymmetric orthorhombic phase after the anneal.

In one embodiment, the ferroelectric material layer 80 comprises, and/or consists essentially of, a transition metal oxide material that is selected from a hafnium oxide based material or a perovskite material. In one embodiment, the ferroelectric material layer 80 is single crystalline or polycrystalline with a predominant crystallographic orientation that is aligned along the vertical direction.

In one embodiment, the ferroelectric material layer 80 has two stable ferroelectric states having two different states of lattice deformation and two different ferroelectric polarization directions. In one embodiment, the two different states of lattice deformation have different average in-plane lattice constants within a horizontal plane. The two different states of lattice deformation apply different in-plane stress (i.e., stress along horizontal direction) to the PMA layer 66 that is subsequently formed on the ferroelectric material layer 80.

The middle electrode 52 includes a thin nonmagnetic metal or metal alloy layer that is thin enough to transmit the strain in the ferroelectric material layer 80 to an overlying material layer, such as the PMA layer 66. In one embodiment, the middle electrode 52 comprises at least one nonmagnetic electrically conductive material such as W, Al Cu, Ru, Mo, Ti, Ta, TiN, TaN, WN, MoN, and/or a stack or an alloy thereof. The thickness of the middle electrode 52 may be in a range from 0.6 nm to 10 nm, such as from 1 nm to 3 nm, although lesser and greater thicknesses may also be employed.

The PMA layer 66 comprises a ferromagnetic material having relatively high perpendicular magnetic anisotropy. The easy axis of magnetization of the PMA layer 66 is parallel to the vertical direction either by pointing upward toward the MTJ 140 or by pointing downward toward the middle electrode 52. In one embodiment, the ferromagnetic material of the PMA layer 66 can include, and/or can consist essentially of a metal or metal alloy which has a higher PMA than that of the free layer 136. For example, the PMA layer 66 may comprise an iron-platinum or an iron-palladium alloy ferromagnetic layer. The thickness of the PMA layer 66 can be in a range from 1 nm to 10 nm, such as from 2 nm to 8 nm, although lesser and greater thicknesses may also be employed.

According to an aspect of the present disclosure, the PMA layer 66 is a strain-modulated ferromagnetic layer having different magnetic interlayer exchange coupling (IEC) magnitude with the free layer 136 depending on the in-plane stress applied by the ferroelectric material layer 80 through the middle electrode 52 to the PMA layer 66. Some ferromagnetic materials have strain-dependent magnetic anisotropy, and the direction of minimum energy of the magnetization of such ferromagnetic materials can switch from one direction to another direction (which may be an opposite direction) depending on the strain applied to the ferroelectric materials. Examples of strain-induced magnetic anisotropy changes are described in Wang et al., E-field Control of the RKKY interaction in FeCoB/Ru/FeCoB/PMN-PT(011) Multiferroic Heterostructures, Advanced Materials, Volume 30, Issue 39 (2018) 1803612, and in Song et al., Recent Progress in voltage control of magnetism: Materials, mechanisms, and performance, Progress in Materials Science, Volume 87, June 2017, Pages 33-82, the entirety of which are incorporated herein by reference.

The nonmagnetic electrically conductive layer 70 is a nonmagnetic spacer layer that includes a metallic material (e.g., metal or metal alloy) that includes a medium for a Ruderman-Kittel-Kasuya-Yosida (RKKY) interaction, which is a long range magnetic exchange coupling mediated by d-shell electron spins or f-shell electron spins of the nonmagnetic elemental metal within the nonmagnetic electrically conductive layer 70. Generally, the nonmagnetic electrically conductive layer 70 may include any nonmagnetic elemental metal that can function as the medium for the RKKY interaction between the PMA layer 66 and the free layer 136. For example, the nonmagnetic electrically conductive layer 70 may include Al, Ti, V, Cr, Mn, Cu, Zn, Zr, Nb, Mo, Ru, Rh, Pd, Ag, Hf, Ta, W, Os, Ir, Pt, Au, etc. For example, the nonmagnetic electrically conductive layer 70 may comprise an Al, Ta or Ir spacer layer.

According to an aspect of the present disclosure, the thickness of the nonmagnetic electrically conductive layer 70 is selected such that the sign of the RKKY exchange coupling between the PMA layer 66 and the free layer 136 changes depending on the ferroelectric state of the ferroelectric material layer 80, which causes the magnetization direction of the free layer 136 to change. In an illustrative example, the thickness of the nonmagnetic electrically conductive layer 70 may be in a range from 0.6 nm to 5 nm, such as from 1.2 nm to 3 nm, although lesser and greater thicknesses may also be employed.

The free layer 136 includes a ferromagnetic material such as CoFeB, CoFe or a combination thereof. If a CoFeB alloy is included in the free layer 136, then the atomic concentration of boron atoms within the CoFeB alloy may be in a range from 10% to 30% (such as 20%), the atomic concentration of cobalt atoms within the CoFeB alloy may be in a range from 10% to 40% (such as 15%), and the atomic concentration of Fe in the CoFeB layer may be in a range from 50% to 90% (such as 65%). The thickness of the free layer 136 can be in a range from 0.5 nm to 2 nm, although lesser and greater thicknesses can also be employed.

The nonmagnetic spacer layer may be a dielectric tunnel barrier layer 134 for forming a magnetic tunnel junction, or may be a metallic spacer layer for forming a giant magnetoresistive structure. For example, the dielectric tunnel barrier layer 134 may comprise, and/or may consist essentially of magnesium oxide. In one embodiment, the dielectric tunnel barrier layer 134 has a thickness in a range from 0.5 nm to 1.5 nm, such as from 0.8 nm to 1 nm.

The reference layer 132 can include a CoFe layer, a CoFeB layer or a combination thereof. The thickness of the reference layer 133 can be in a range from 1 nm to 5 nm, although lesser and greater thicknesses can also be employed. The reference layer 132 has a fixed magnetization that does not change during operation of the memory cell 380. The direction of the fixed magnetization direction of the reference layer 132 is herein referred to as a fixed reference magnetization direction, which may be an upward vertical direction or a downward vertical direction. The magnetization direction of the reference layer 132 may be fixed by a hard magnetic layer or a synthetic antiferromagnetic (SAF) structure (not shown) located above the reference layer 132.

The magnetization direction of the free layer 136 can change during operation of the memory cell 380. The magnetization direction of the free layer 136 is herein referred to as a free magnetization direction.

The magnetization of the PMA layer 66 remains fixed during operation of the memory cell 380. The magnetization direction of the PMA layer 66 is herein referred to as a PMA magnetization direction, which may be parallel or antiparallel to the direction of the magnetization of the reference layer 32. The exchange coupling between the magnetization of the free layer 136 and the magnetization of the PMA layer 66 is mediated by an RKKY interaction, and as such, the sign of the exchange coupling may be positive or negative. As discussed above, the sign of the interlayer exchange coupling reverses (i.e., changes) depending on the change in strain of the PMA layer 66. The strain of the PMA layer 66 is changed by the change of the ferroelectric polarization direction of the ferroelectric material layer 80. The ferroelectric polarization direction of the ferroelectric material layer 80 is changed by applying a voltage or current between the second terminal electrode (i.e., the programming electrode) 92 and the middle electrode 52. Thus, the energetically favorable direction for the magnetization of the free layer 136 changes with a small change in the strain of the PMA layer 66, which can be induced by the ferroelectric transition in the ferroelectric material layer 80.

According to an aspect of the present disclosure, the exchange coupling between the free layer 136 and the PMA layer 66 can be positive or negative depending on the relative alignment (i.e., parallel alignment or antiparallel alignment) and depending on the strain applied by the ferroelectric material layer 80 to the strain-modulated ferromagnetic PMA layer 66. Specifically, the sign of the interlayer exchange coupling between the free layer 136 and the PMA layer 66 may be negative for one of the parallel or antiparallel alignment of the magnetizations of the free layer 136 and the PMA layer 66 when the ferroelectric material layer 80 is in a first ferroelectric state, and may be positive for the other of the parallel or antiparallel alignment when the ferroelectric material layer 80 is in a second ferroelectric state. The two different ferroelectric states may have opposite ferroelectric polarization directions.

Generally, the sign of the interlayer exchange coupling between the free layer 136 and the PMA layer 66 changes when the ferroelectric state of the ferroelectric material layer 80 changes between the first ferroelectric state that applies a first in-plane average stress to the PMA layer 66, and the second ferroelectric state that applies a second in-plane average stress to the PMA layer 66. A change in the sign of the interlayer exchange coupling between the free layer 136 and the magnetization of the PMA layer 66 causes flipping of the magnetization direction of the free layer 136 between a parallel alignment and an antiparallel alignment with the constant magnetization direction of the PMA layer 66.

In the first exemplary memory cell 380, the magnetic tunnel junction 140 can be configured such that the free layer 136 is spaced from the PMA layer 66 by the nonmagnetic electrically conductive layer 70, which is different from a nonmetallic spacer layer (such as the dielectric tunnel barrier layer 134) that is provided between the reference layer 132 and the free layer 136. The ferroelectric material layer 80 may be located directly on a first surface of the middle electrode 52, and the PMA layer 66 may be located directly on a second surface of the middle electrode 52. The free layer 136 has a free magnetization having two stable magnetization directions. The sign of magnetic interlayer exchange coupling between the PMA layer 66 and the free layer 136 is different for the two stable ferroelectric states of the ferroelectric material layer 80.

Generally, a strain-modulated ferromagnetic PMA layer 66 may be located directly on a second surface of the middle electrode 52. A magnetoresistive layer stack comprising the reference layer 132, the nonmagnetic spacer layer, and the free layer 136 can be disposed between the first terminal electrode 32 and the middle electrode 52. In the first embodiment, the nonmagnetic spacer layer may comprise the dielectric tunnel barrier layer 134. In this case, the magnetoresistive layer stack comprises a magnetic tunnel junction providing a tunneling magnetoresistance (TMR) effect. In the second embodiment described below with respect to FIG. 3, the nonmagnetic spacer layer may be nonmagnetic electrically conductive spacer layer (i.e., a second nonmagnetic electrically conductive layer) 234. In this case, the magnetoresistive layer stack comprises a giant magnetoresistive stack providing the giant magnetoresistance (GMR) effect.

Generally, a programming circuit can be provided, which can be electrically connected to the middle electrode 52 and the second terminal electrode 92. The programming circuit can be configured to apply two types of programming voltage pulses between the middle electrode 52 and the second terminal electrode 92 (e.g., between the programming bit line 90 and the word line 60). In one embodiment, the two types of programming voltage pulses may have two different polarities (i.e., a positive polarity for one type of programming pulse and a negative polarity for another type of programming pulse), and may have magnitudes that induce a ferroelectric transition of the ferroelectric material layer 80 between two ferroelectric states. For example, the magnitude of each pulse may be in a range from 0.5 V to 5 V, such as from 1 V to 4 V.

A sensing circuit can be provided, which can be electrically connected to the first terminal electrode 32 and the middle electrode 52, and can be configured to apply a sensing voltage pulse across the first terminal electrode 32 and the middle electrode 52. The sensing circuit can be configured to measure tunneling magnetoresistance (TMR) of the magnetoresistive layer stack 140 by applying a sensing (i.e., read) voltage between the first terminal electrode 32 and the middle electrode 52 (e.g., between the sensing bit line 30 and the word line 60), and measuring the TMR (e.g., measuring the tunneling current and determining the TMR) through the MTJ 140. The sensing voltage magnitude should be sufficiently small to avoid changing the magnetization direction of the free layer 136.

Referring to FIG. 3, a second exemplary magnetoresistive memory device according to a second embodiment of the present disclosure is illustrated, which can be derived from the first exemplary magnetoresistive memory device illustrated in FIG. 3 by omitting the nonmagnetic electrically conductive layer 70 and the PMA layer 66, and by employing the giant magnetoresistance (GMR) junction structure 240 as a magnetic junction structure. In this case, the GMR junction structure 240 includes a reference layer 132, a nonmagnetic spacer layer that is a nonmagnetic electrically conductive layer (e.g., a nonmagnetic metal spacer layer) 234, and a free layer 136. The material composition and the thickness range of each element of the second exemplary magnetoresistive memory device that has a counterpart with a same reference numeral in the first exemplary magnetoresistive memory device can be the same as in the first exemplary magnetoresistive memory device.

In the second exemplary magnetoresistive memory device, the reference layer 132 may be located over or directly on the second surface of the middle electrode 52. The free layer 136 may be more distal from the middle electrode 52 than the reference layer 132 is from the middle electrode 52, and is spaced from the reference layer 132 by the nonmagnetic electrically conductive layer 234. According to an aspect of the present disclosure, the nonmagnetic electrically conductive layer 234 provides the interlayer exchange coupling between the free layer 136 and the reference layer 132. Therefore, the PMA layer 66 is not required in the second embodiment to provide an interlayer exchange coupling to the free layer 136 which causes the magnetization direction of the free layer 136 to switch when the sign of the interlayer exchange coupling changes.

Specifically, the nonmagnetic electrically conductive layer 234 is a nonmagnetic spacer layer that includes a metallic material that includes a medium for a Ruderman-Kittel-Kasuya-Yosida (RKKY) interaction. Generally, the nonmagnetic electrically conductive layer 234 may include any nonmagnetic elemental metal that can function as the medium for the RKKY interaction between the reference layer 132 and the free layer 136. For example, the nonmagnetic electrically conductive layer 234 may include Al, Ti, V, Cr, Mn, Cu, Zn, Zr, Nb, Mo, Ru, Rh, Pd, Ag, Cd, La, Ce, Pr, Pm, Eu, Er, Tm, Yb, Lu, Hf, Ta, W, Re, Os, Ir, Pt, Au, etc. In an illustrative example, the thickness of the nonmagnetic electrically conductive layer 234 may be in a range from 0.6 nm to 5 nm, such as from 1.2 nm to 3 nm, although lesser and greater thicknesses may also be employed.

According to the second embodiment, the sign of the RKKY interlayer exchange coupling between the reference layer 132 and the free layer 136 changes depending on the ferroelectric state of the ferroelectric material layer 80. In the second embodiment, an applied programming (i.e., writing) voltage between the middle electrode 52 and the second terminal electrode 32 changes the ferroelectric polarization direction of the ferroelectric material layer 80. As in the first embodiment, the change in the ferroelectric polarization direction creates strain that propagates though the thin middle electrode 52 and reverses the sign of interlayer exchange coupling between the reference layer 132 and the free layer 136. Reversing the sign of the interlayer exchange coupling changes the magnetization direction of the free layer 136. This changes the resistance state (i.e., the GMR state) of the GMR junction structure 240, which corresponds to programming (i.e., writing) the memory cell 380 of the second embodiment.

To read the memory cell 380, a small sensing (i.e., read) voltage (i.e., smaller magnitude voltage than the programming voltage) is applied between the middle electrode 52 and the first terminal electrode 32. The current measured between these electrodes is then used to determine the GMR state of the GMR junction structure 240 (i.e., the resistance state of the memory cell 380).

Figure 4:
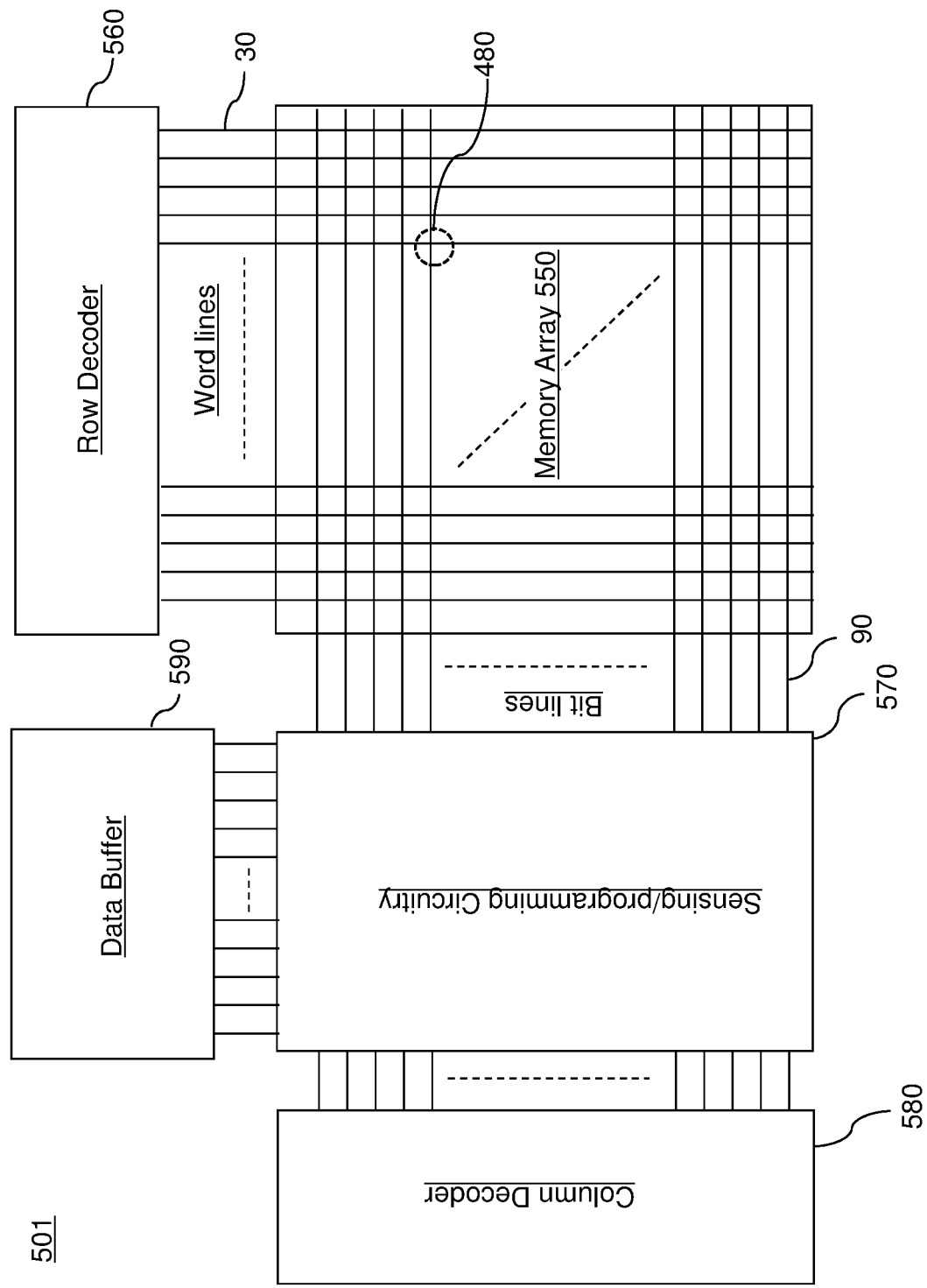
FIG. 4 is a schematic diagram of an exemplary circuit including an array of two-terminal magnetoresistive memory cells according to an embodiment of the present disclosure.

Referring to FIG. 4, a schematic diagram is shown for an exemplary circuit including an array of two terminal memory cells 480 of the third embodiment. The array of memory cells 480 may be configured as a two-dimensional array or as a three-dimensional array including a stack of multiple two-dimensional arrays. In one embodiment, the exemplary circuit may comprise a random access memory (RAM) device 501 including the memory cells 480 in an array configuration. According to an aspect of the present disclosure, the memory cells 480 may comprise two-terminal magnetoresistive memory cells. In this case, the RAM device 501 can be a random access memory device including a two-terminal magnetoresistive memory element within each memory cell 480.

In one embodiment, the RAM device 501 includes a memory array region 550 including word lines and bit lines. In one embodiment, a first terminal electrode of each memory cell 480 can be electrically connected to one of the bit lines, and a second terminal electrode of each memory cell 480 can be electrically connected to one of the word lines. In one embodiment, the bit lines may comprise the first electrically conductive lines 30 and the word lines may comprise the second electrically conductive lines 90. Alternatively, the word lines may comprise the first electrically conductive lines 30 and the bit lines comprise the second electrically conductive lines 90. While the exemplary circuit illustrates an exemplary configuration for routing the bit lines and the word lines, various other types of routing electrically conductive lines may also be employed provided that each memory cell 480 is accessed by a respective set of two different independently-controlled electrically conductive lines. In the third embodiment, each bit line functions as both a sensing and as a programming bit line, depending on the magnitude of the voltage applied to the bit line. Thus, separate sensing bit lines of the first and second embodiment are omitted in the third embodiment.

In an illustrative example, the RAM device 501 may also contain a row decoder 560 connected to the word lines and a sensing/programming circuitry 570 connected to the bit lines. A column decoder 580 and a data buffer 590 can be connected to the sensing/programming circuitry 570. Multiple instances of the memory cells 480 are provided in an array configuration that forms the RAM device 501. It should be noted that the location and interconnection of elements are schematic and the elements may be arranged in a different configuration. Further, a memory cell 480 may be manufactured as a discrete device, i.e., a single isolated device.

Each memory cell 480 includes a magnetic junction structure having at least two different resistive states depending on the alignment of magnetizations of different magnetic material layers. The magnetic junction structure within each memory cell 480 is provided between a first terminal electrode and a second terminal electrode.

Figure 5:
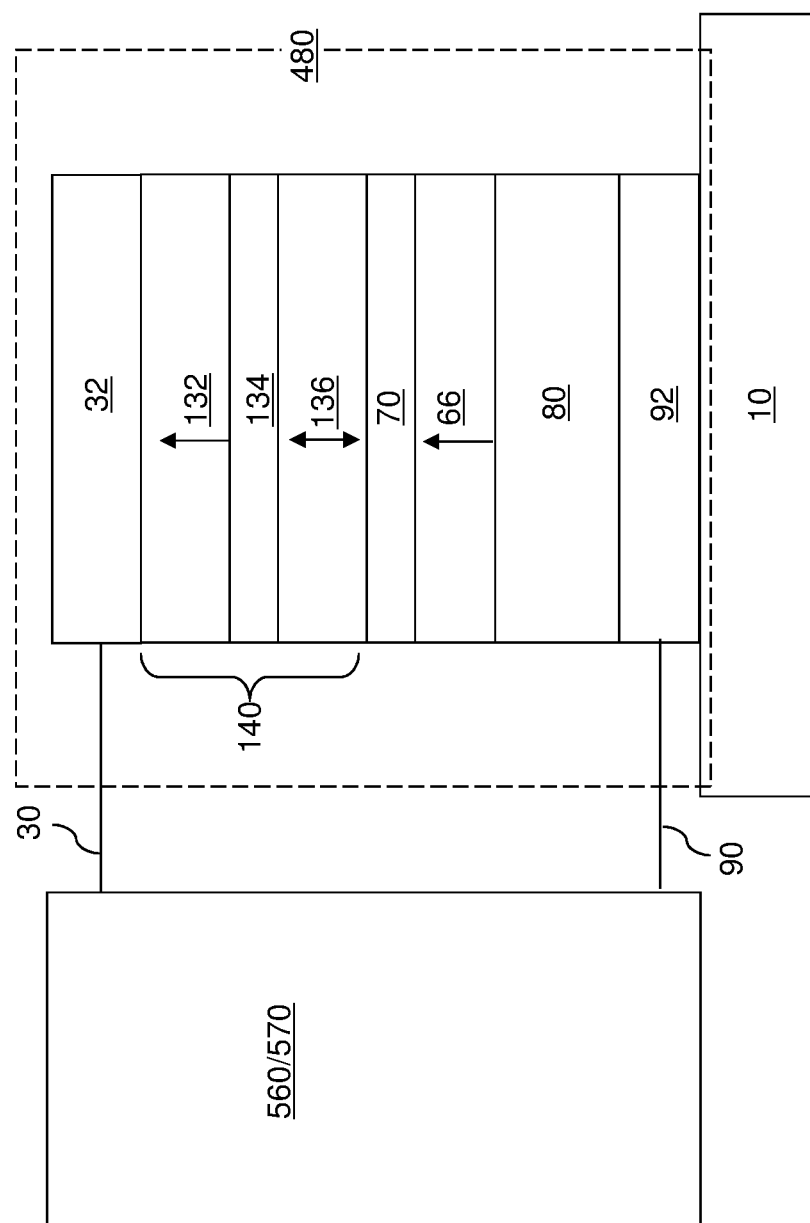
FIG. 5 illustrates a third exemplary magnetoresistive memory device according to a third embodiment of the present disclosure.

Referring to FIG. 5, a third exemplary magnetoresistive memory device according to the third embodiment of the present disclosure is illustrated, which comprises a memory cell 480 that is a two-terminal magnetoresistive memory cell, and a portion of a sensing/programming circuitry configured to program the two-terminal magnetoresistive memory cell. The two-terminal magnetometries memory cell of FIG. 5 may be employed as a memory cell 480 within the MRAM device 501 illustrated in FIG. 4, and the portion of the sensing/programming circuitry illustrated in FIG. 5 may be a portion of the periphery circuitry illustrated in FIG. 5.

According to the embodiment of the present disclosure, the two-terminal magnetoresistive memory cell 480 illustrated in FIG. 5 may be derived from the three-terminal magnetoresistive memory cell 380 illustrated in FIG. 2 by omitting formation of the middle electrode 52. In this case, the two-terminal magnetoresistive memory cell 380 may comprise, from one side to another in a sequential order, a first terminal electrode 32, the magnetic junction structure, such as the magnetic tunnel junction 140, the nonmagnetic electrically conductive layer 70, the PMA layer 66, the ferroelectric material layer 80, and the second terminal electrode 92, as described above with respect to the first embodiment of FIG. 2. Thus, the various components of the two-terminal magnetoresistive memory cell 480 may have the same material composition and the same thickness range as a counterpart in the three-terminal magnetoresistive memory cell 380 having the same reference numeral.

The two-terminal magnetoresistive memory cell 480 of the third embodiment is programmed by applying a programming voltage between the first terminal electrode 32 and the second terminal electrode 92. The programming (i.e., writing) voltage changes the ferroelectric polarization direction of the ferroelectric material layer 80. As in the first embodiment, the change in the ferroelectric polarization direction creates strain in the adjacent PMA layer 66. The stain induced in the PMA layer 66 reverses the sign of interlayer exchange coupling between the PMA layer 66 and the free layer 136. Reversing the sign of the interlayer exchange coupling changes the magnetization direction of the free layer 136. This changes the resistance state (i.e., the TMR state) of the tunnel junction structure 140, which corresponds to programming (i.e., writing) the memory cell 480 of the third embodiment. The third embodiment is advantageous compared to the first embodiment in that the strain is provided directed from the ferroelectric material layer 80 to the adjacent PMA layer 66 without having to be transmitted through the middle electrode 52. Thus, a greater strain induced effect may be provided to the PMA layer 66 to improve the switching of the magnetization direction of the free layer 136.

To read the memory cell 480, a small sensing (i.e., read) voltage (i.e., smaller magnitude voltage than the programming voltage) is applied between the first terminal electrode 32 and the second terminal electrode 92. The read current measured between these electrodes is then used to determine the resistance state (e.g., the TMR state) of the MTJ 140 (i.e., the resistance state of the memory cell 480). The sensing voltage of the third embodiment may be higher than the sensing voltage of the first embodiment because the tunneling current has to tunnel through the insulating ferroelectric material layer 80 in order to be detected.

A memory device 500 of the first and second embodiments of FIGS. 1-3 includes at least one three-terminal magnetoresistive memory cell 380 which comprises a first terminal electrode 32, a second terminal electrode 92, a middle electrode 52 located between the first terminal electrode 32 and the second terminal electrode 92, a magnetoresistive layer stack (140, 240) comprising a reference layer 132, a free layer 136 and a nonmagnetic spacer layer (134, 234) located between the reference layer and the free layer, wherein the magnetoresistive layer stack is located between the first terminal electrode 32 and the middle electrode 52, and a ferroelectric material layer 80 located between the middle electrode 52 and the second terminal electrode 80.

In the first embodiment shown in FIG. 2, a perpendicular magnetic anisotropy (PMA) layer 66 is located between the ferroelectric material layer 80 and the magnetoresistive layer stack 140, and nonmagnetic electrically conductive layer 70 is located between the PMA layer 66 and the free layer 33.

In the first embodiment, the nonmagnetic spacer layer 134 comprises a dielectric tunnel barrier layer, the magnetoresistive layer stack comprises a magnetic tunnel junction 140, the PMA layer 66 has a higher PMA than a PMA of the free layer 136, and the PMA layer 66 and the free layer 136 are magnetically exchange-coupled across the nonmagnetic electrically conductive layer 70. A sign of an interlayer exchange coupling coefficient of the magnetic coupling between the PMA layer 66 and the free layer changes 136 based on a strain applied to the PMA layer 66 by the ferroelectric material layer 80 across the middle electrode 52. The ferroelectric material layer 80 has two stable ferroelectric states having two different states of lattice deformation.

In the first embodiment, a programming circuit (560, 570) is electrically connected to the middle electrode 52 and the second terminal electrode 92 and configured to apply two types of programming voltages between the middle electrode and the second terminal electrode. The two types of programming voltages have two different polarities and have magnitudes that induce a ferroelectric transition of the ferroelectric material layer 80 between the two stable ferroelectric states. The two stable ferroelectric states of the ferroelectric material layer 80 apply different first and second in-plane stresses to the PMA layer 66 across the middle electrode 52, a change between the first and the second in-plane stresses applied to the PMA layer 66 changes the sign of the interlayer coupling coefficient between the PMA layer 66 and the free layer 136, and the change of the sign of the interlayer coupling coefficient changes a magnetization direction of the free layer 136. A sensing circuit 570 is electrically connected to the first terminal electrode 32 and the middle electrode 52 and configured to apply a sensing voltage between the first terminal electrode and the middle electrode to determine a tunneling magnetoresistance across the magnetoresistive layer stack 140.

In the first embodiment, a first (e.g., bottom) surface of the PMA layer 66 directly contacts a first (e.g., top) surface of the middle electrode 52, a surface of the ferroelectric material layer 80 directly contacts a second (e.g., bottom) surface of the middle electrode 52 opposite to the first surface of the middle electrode, a second (e.g., top) surface of the PMA layer 66 directly contacts a first (e.g., bottom) surface of the nonmagnetic electrically conductive layer 70, a first (e.g., bottom) surface of the free layer 136 directly contacts a second (e.g., top) surface of the nonmagnetic electrically conductive layer 70 opposite to the first surface of the nonmagnetic electrically conductive layer, and a second (e.g., top) surface of the free layer directly contacts a surface of the dielectric tunnel barrier layer 134. The free layer 136 may comprise a CoFe or CoFeB ferromagnetic layer, and the PMA layer 66 may comprise a FePt or FePd ferromagnetic layer or a Co/Pt multilayer (i.e., a stack of alternating Co and Pt layers).

A method of operating the three-terminal magnetoresistive memory cell 380 of the first embodiment includes applying a first programming voltage between the second terminal electrode 92 and the middle electrode 52 to change a state of the ferroelectric material layer 80 from a second ferroelectric state to a first ferroelectric state, such that a first in-plane stress is applied to the PMA layer 66 across the middle electrode 52, which changes the sign of the interlayer coupling coefficient between the PMA layer 66 and the free layer 136 and changes a magnetization direction of the free layer 136 to be parallel to a magnetization direction of the reference layer 132. The method also includes applying a second programming voltage having an opposite polarity to the first programming voltage between the second terminal electrode 92 and the middle electrode 52 to change the state of the ferroelectric material layer 80 from the first ferroelectric state to the second ferroelectric state, such that a second in-plane stress is applied to the PMA layer 66 across the middle electrode 52, which changes the sign of the interlayer coupling coefficient between the PMA layer 66 and the free layer 136 and changes the magnetization direction of the free layer 136 to be antiparallel to the magnetization direction of the reference layer 132. The method also includes applying a sensing voltage between the first terminal electrode 32 and the middle electrode 52 to determine a tunneling magnetoresistance across the magnetoresistive layer stack 140.

In the second embodiment shown in FIG. 3, the nonmagnetic spacer layer comprises a nonmagnetic electrically conductive spacer layer 234, the magnetoresistive layer stack 240 comprises a giant magnetoresistance (GMR) junction structure, the reference layer 132 and the free layer 136 are magnetically coupled across the nonmagnetic electrically conductive spacer layer 234, and a sign of an interlayer exchange coupling coefficient of the magnetic coupling between the reference layer 132 and the free layer 135 changes based on a strain applied to the reference layer 132 by the ferroelectric material layer 80 across the middle electrode 52.

In the second embodiment, the programming circuit (560, 570) is electrically connected to the middle electrode 52 and the second terminal electrode 92 and configured to apply two types of programming voltages between the middle electrode and the second terminal electrode, and a sensing circuit 570 is electrically connected to the first terminal electrode 32 and the middle electrode 52 and configured to apply a sensing voltage between the first terminal electrode and the middle electrode to determine a magnetoresistance across the magnetoresistive layer stack 240.

In the second embodiment, the ferroelectric material layer 80 has two stable ferroelectric states having two different states of lattice deformation, the two types of programming voltages have two different polarities and have magnitudes that induce a ferroelectric transition of the ferroelectric material layer 80 between the two stable ferroelectric states, the two stable ferroelectric states of the ferroelectric material layer 80 apply different first and second in-plane stresses to the reference layer 132 across the middle electrode 52, a change between the first and the second in-plane stresses applied to the reference layer 132 changes the sign of the interlayer coupling coefficient between the reference layer 132 and the free layer 136, and the change of the sign of the interlayer coupling coefficient changes a magnetization direction of the free layer 136.

In the second embodiment, a surface of the reference layer 132 directly contacts a first (e.g., top) surface of the middle electrode 52, and a surface of the ferroelectric material layer 80 directly contacts a second (e.g., bottom) surface of the middle electrode opposite 52 to the first surface of the middle electrode.

A method of operating the three-terminal magnetoresistive memory cell 380 of the second embodiment includes applying a first programming voltage between the second terminal electrode 92 and the middle electrode 52 to change a state of the ferroelectric material layer 80 from a second ferroelectric state to a first ferroelectric state, such that a first in-plane stress is applied to the reference layer 132 across the middle electrode 52, which changes the sign of the interlayer coupling coefficient between the reference layer 132 and the free layer 136 and changes a magnetization direction of the free layer 136 to be parallel to a magnetization direction of the reference layer 132. The method also includes applying a second programming voltage having an opposite polarity to the first programming voltage between the second terminal electrode 92 and the middle electrode 52 to change the state of the ferroelectric material layer 80 from the first ferroelectric state to the second ferroelectric state, such that a second in-plane stress is applied to the reference layer 132 across the middle electrode 52, which changes of the sign of the interlayer coupling coefficient between the reference layer 132 and the free layer 136 and changes the magnetization direction of the free layer 136 to be antiparallel to the magnetization direction of the reference layer 132. The method also includes applying a sensing voltage between the first terminal electrode 32 and the middle electrode 52 to determine a magnetoresistance across the magnetoresistive layer stack 240.

In the first and third embodiments shown in FIGS. 1, 2, 4 and 5, a memory device (500, 501) includes at least one magnetoresistive memory cell (380, 480) which comprise a first terminal electrode 32, a second terminal electrode 92, a magnetoresistive layer stack 140 comprising a reference layer 132, a free layer 136 and a dielectric tunnel barrier layer 134 located between the reference layer and the free layer, wherein the magnetoresistive layer stack 140 is located between the first terminal electrode and the second terminal electrode, a perpendicular magnetic anisotropy (PMA) layer 66 having a higher PMA than a PMA of the free layer 136, wherein the PMA layer is located between the second terminal electrode 92 and the magnetoresistive layer stack 140, a nonmagnetic electrically conductive layer 70 located between the PMA layer 66 and the free layer 136, and a ferroelectric material layer 80 located between the PMA layer 66 and the second terminal electrode 92.

In the first embodiment shown in FIG. 2, a middle electrode 52 is located between the ferroelectric material layer 80 and the PMA layer 66, as described above.

In the third embodiment shown in FIG. 5, the PMA layer 66 is in contact with the ferroelectric material layer 80 and the nonmagnetic electrically conductive layer 70. The PMA layer 66 and the free layer 136 are magnetically exchange-coupled across the nonmagnetic electrically conductive layer 70. The magnetic coupling between the PMA layer 66 and the free layer 136 is modulated by strain within the PMA layer 66. A sign of an interlayer exchange coupling coefficient of the magnetic coupling between the PMA layer 66 and the free layer 136 changes based on a strain applied to the PMA layer 66 by the ferroelectric material layer 80.

In the third embodiment, a programming circuit (560, 570) is electrically connected to the first terminal electrode 32 and the second terminal electrode 92 and configured to apply two types of programming voltages between the first terminal electrode and the second terminal electrode. The two types of programming voltages have two different polarities and have magnitudes that induce a ferroelectric transition of the ferroelectric material layer 80 between the two ferroelectric states. A sensing circuit 570 is electrically connected to the first terminal electrode 32 and the second terminal electrode 92 and configured to apply a sensing voltage between the first terminal electrode and the second terminal electrode. The sensing circuit 570 is configured to measure a tunneling magnetoresistance (TMR) of the magnetoresistive layer stack 140.

A method of operating the two terminal magnetoresistive memory cell of 480 of the third embodiment includes applying a first programming voltage between the second terminal electrode 92 and the first terminal electrode 32 to change a state of the ferroelectric material layer 80 from a second ferroelectric state to a first ferroelectric state, such that a first in-plane stress is applied to the PMA layer 66 by the ferroelectric material layer 80, which changes the sign of the interlayer coupling coefficient between the PMA layer 66 and the free layer 136 and changes a magnetization direction of the free layer 136 to be parallel to a magnetization direction of the reference layer 132. The method also includes applying a second programming voltage having an opposite polarity to the first programming voltage between the second terminal electrode 92 and the first terminal electrode 32 to change the state of the ferroelectric material layer 80 from the first ferroelectric state to the second ferroelectric state, such that a second in-plane stress is applied to the PMA layer 66 by the ferroelectric material layer 80, which changes the sign of the interlayer coupling coefficient between the PMA layer 66 and the free layer 136 and changes the magnetization direction of the free layer 136 to be antiparallel to the magnetization direction of the reference layer 132. The method also includes applying a sensing voltage between the first terminal electrode 32 and the second terminal electrode 92 to determine a tunneling magnetoresistance across the magnetoresistive layer stack 140.

Thus, in the embodiments of the present disclosure, the magnetization direction of the free layer may be set using ferroelectric controlled interlayer exchange coupling of the ferromagnetic free layer and another ferromagnetic layer (e.g., the PMA layer or the reference layer). The electric field controlled strain from ferroelectric material layer that reverses the sign of exchange coupling between ferromagnetic layers. Written information can be read through either TMR or GMR effect.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device comprising at least one magnetoresistive memory cell which comprises:
   a first terminal electrode;
   a second terminal electrode;
   a magnetoresistive layer stack comprising a reference layer, a free layer and a dielectric tunnel barrier layer located between the reference layer and the free layer, wherein the magnetoresistive layer stack is located between the first terminal electrode and the second terminal electrode;
   a perpendicular magnetic anisotropy (PMA) layer having a higher PMA than a PMA of the free layer, wherein the PMA layer is located between the second terminal electrode and the magnetoresistive layer stack;
   a nonmagnetic electrically conductive layer located between the PMA layer and the free layer; and
   a ferroelectric material layer located between the PMA layer and the second terminal electrode;
   wherein the PMA layer and the free layer are magnetically exchange-coupled across the nonmagnetic electrically conductive layer; and
   wherein a magnetic coupling between the PMA layer and the free layer is modulated by strain within the PMA layer.

2. The memory device of claim 1, wherein a sign of an interlayer exchange coupling coefficient of the magnetic coupling between the PMA layer and the free layer changes based on a strain applied to the PMA layer by the ferroelectric material layer.

3. The memory device of claim 2, wherein the ferroelectric material layer has two stable ferroelectric states having two different states of lattice deformation.

4. The memory device of claim 3, wherein the two different states of lattice deformation have different average in-plane lattice constants within a horizontal plane that is parallel to an interface between the ferroelectric material layer and the PMA layer.

5. The memory device of claim 4, wherein:
   the two stable ferroelectric states of the ferroelectric material layer apply different first and second in-plane stresses to the PMA layer across the middle electrode;
   a change between the first and the second in-plane stresses applied to the PMA layer changes the sign of the interlayer coupling coefficient between the PMA layer and the free layer; and
   the change of the sign of the interlayer coupling coefficient changes a magnetization direction of the free layer.

6. The memory device of claim 5, further comprising a programming circuit electrically connected to the first terminal electrode and the second terminal electrode and configured to apply two types of programming voltages between the first terminal electrode and the second terminal electrode.

7. The memory device of claim 6, wherein the two types of programming voltages have two different polarities and have magnitudes that induce a ferroelectric transition of the ferroelectric material layer between the two ferroelectric states.

8. The memory device of claim 7, further comprising a sensing circuit electrically connected to the first terminal electrode and the second terminal electrode and configured to apply a sensing voltage between the first terminal electrode and the second terminal electrode.

9. The memory device of claim 8, wherein the sensing circuit is configured to measure a tunneling magnetoresistance (TMR) of the magnetoresistive layer stack.

10. A memory device comprising at least one magnetoresistive memory cell which comprises:
    a first terminal electrode;
    a second terminal electrode;
    a magnetoresistive layer stack comprising a reference layer, a free layer and a dielectric tunnel barrier layer located between the reference layer and the free layer, wherein the magnetoresistive layer stack is located between the first terminal electrode and the second terminal electrode;
    a perpendicular magnetic anisotropy (PMA) layer having a higher PMA than a PMA of the free layer, wherein the PMA layer is located between the second terminal electrode and the magnetoresistive layer stack;
    a nonmagnetic electrically conductive layer located between the PMA layer and the free layer; and
    a ferroelectric material layer located between the PMA layer and the second terminal electrode;
    wherein the ferroelectric material layer comprises a transition metal oxide material that is selected from a hafnium oxide based material or a perovskite material, and wherein the ferroelectric material layer is single crystalline or polycrystalline with a predominant crystallographic orientation that is aligned along a vertical direction.

11. A memory device comprising at least one magnetoresistive memory cell which comprises:
    a first terminal electrode;
    a second terminal electrode;
    a magnetoresistive layer stack comprising a reference layer, a free layer and a dielectric tunnel barrier layer located between the reference layer and the free layer, wherein the magnetoresistive layer stack is located between the first terminal electrode and the second terminal electrode;
    a perpendicular magnetic anisotropy (PMA) layer having a higher PMA than a PMA of the free layer, wherein the PMA layer is located between the second terminal electrode and the magnetoresistive layer stack;
    a nonmagnetic electrically conductive layer located between the PMA layer and the free layer; and
    a ferroelectric material layer located between the PMA layer and the second terminal electrode;
    wherein:
    the free layer comprises a CoFe or CoFeB ferromagnetic layer; and
    the PMA layer comprises a FePt or FePd ferromagnetic layer or a Co/Pt multilayer.

12. A memory device comprising at least one magnetoresistive memory cell which comprises:
    a first terminal electrode;
    a second terminal electrode;
    a magnetoresistive layer stack comprising a reference layer, a free layer and a dielectric tunnel barrier layer located between the reference layer and the free layer, wherein the magnetoresistive layer stack is located between the first terminal electrode and the second terminal electrode;
    a perpendicular magnetic anisotropy (PMA) layer having a higher PMA than a PMA of the free layer, wherein the PMA layer is located between the second terminal electrode and the magnetoresistive layer stack;

a nonmagnetic electrically conductive layer located between the PMA layer and the free layer;

a ferroelectric material layer located between the PMA layer and the second terminal electrode;

a middle electrode located between the ferroelectric material layer and the PMA layer;

a programming circuit electrically connected to the middle electrode and the second terminal electrode and configured to apply two types of programming voltages between the middle electrode and the second terminal electrode, wherein the two types of programming voltages have two different polarities and have magnitudes that induce a ferroelectric transition of the ferroelectric material layer between the two stable ferroelectric states; and a sensing circuit electrically connected to the first terminal electrode and the middle electrode and configured to apply a sensing voltage between the first terminal electrode and the middle electrode to determine a tunneling magnetoresistance across the magnetoresistive layer stack.

\* \* \* \* \*